United States Patent [19]
Campbell et al.

[11] Patent Number: 5,256,991
[45] Date of Patent: Oct. 26, 1993

[54] BROADBAND MICROWAVE ACTIVE INDUCTOR CIRCUIT

[75] Inventors: Charles F. Campbell, Ames; Robert J. Weber, Boone, both of Iowa

[73] Assignee: Iowa State University Research Foundation, Inc., Ames, Iowa

[21] Appl. No.: 883,690

[22] Filed: May 15, 1992

[51] Int. Cl.[5] .......................................... H03H 11/50
[52] U.S. Cl. .................................. 333/215; 307/490
[58] Field of Search ................ 333/214, 215; 307/490, 307/510

[56] References Cited

U.S. PATENT DOCUMENTS

| | | |
|---|---|---|
| 2,800,586 | 7/1953 | Towner . |
| 3,397,363 | 8/1968 | Dias . |
| 3,510,806 | 5/1970 | Gremillet . |
| 3,581,123 | 5/1971 | Pest . |
| 3,599,008 | 8/1971 | Gerski-Papiel . |
| 3,750,037 | 7/1973 | Schmidt . |
| 3,993,968 | 11/1976 | Lee . |
| 4,290,036 | 9/1981 | Moulding et al. . |
| 4,292,468 | 9/1981 | Yokoyama . |
| 4,395,690 | 7/1983 | Parras . |
| 4,788,461 | 11/1988 | Snyder . |
| 4,896,053 | 1/1990 | Kesselring . |
| 5,012,201 | 4/1991 | Morita et al. . |
| 5,030,927 | 7/1991 | Itoh . |
| 5,202,655 | 4/1993 | Hara ................................. 333/215 |

FOREIGN PATENT DOCUMENTS 40944 3/1977 Japan .................................... 333/214

OTHER PUBLICATIONS

S. Hara et al., "Broad-Band Monolithic Microwave Active Inductor and Its Application to Miniaturized Wide-Band Amplifiers", IEEE Transactions on Microwave Theory and Techniques, vol. 36, No. 12, pp. 1920-1924 (Dec. 1988).

S. Hara et al., "Lossless Broad-Band Monolithic Microwave Active Inductors", IEEE Transactions On Microwave Theory and Techniques, vol. 37, No. 12, pp. 1979-1984 (Dec. 1989).

*Primary Examiner*—Paul Gensler
*Attorney, Agent, or Firm*—Leydig, Voit & Mayer

[57] ABSTRACT

A broadband microwave active inductor circuit for producing a flat inductive response versus frequency comprises a pair of bipolar transistors arranged in a gyrator configuration for producing an active inductance. Because the transistors exhibit intrinsic characteristics which influence the inductive response of the active inductor circuit, a feedback network is connected to the gyrator configuration to compensate for the intrinsic characteristics of the transistors so that the active inductor circuit realizes a flat inductive response over a wide range of frequencies including microwave frequencies.

17 Claims, 4 Drawing Sheets

BROADBAND MICROWAVE ACTIVE INDUCTOR CIRCUIT

FIELD OF THE INVENTION

The present invention relates to active inductor circuits, and more particularly, to active inductor circuits for use in monolithic microwave integrated circuits.

BACKGROUND OF THE INVENTION

In the design of microwave amplifiers, lumped element networks are often required to obtain an impedance match between the source and the load or to improve the bandwidth of the circuit. The realization of lumped element networks on monolithic microwave integrated circuits (MMICs) is often accomplished with capacitors and spiral inductors. However, the use of spiral inductors presents certain significant limitations. For example, spiral inductors require large amounts of substrate area and air bridges, and for higher inductance values, the amount of substrate area increases further. Additionally, spiral inductors have limited bandwidths, high series resistance, cross-talk problems, and are quite difficult to model accurately. These limitations in the use of spiral inductors have provided a motivation to replace spiral inductors with active circuits capable of realizing inductance.

Inductance has been synthesized extensively with active devices in the audio frequency range with the use of generalized immittance converters (GICs), which are readily realized with operational amplifiers or operational transconductance amplifiers. Additionally, active shunt peaking to increase the bandwidth of VHF amplifiers has been accomplished by exploiting the inductive output impedance of a common collector transistor, as described in J. Choma, and A. E. Cosand, "A Broad-Banded Integrated Common-Collector Common-Base Differential Quartet", *IEEE Journal of Solid-State Circuits*, SC-16, No. 2, pp. 86-93 (April 1981). However, at microwave frequencies these circuits cannot be used, and other methods of simulating inductance must be employed.

Another active circuit which has been utilized to simulate inductance is the gyrator. A gyrator is a non-reciprocal two-port network which presents an impedance at one port proportional to the reciprocal of the impedance attached to a second port. In other words, a gyrator is basically an impedance inverter, where the load on the output is the inverse of the impedance on the input. A gyrator can simulate an inductance when a capacitor is connected to the second port, and as such is useful for active filter networks. FIG. 1a illustrates an ideal circuit model 10 of a gyrator, which includes a first voltage controlled current source 12 and a second voltage controlled current source 14. Circuit 10 realizes gyrator action since current source 12 is oriented such that current enters the common node 16, while current source 14 is oriented such that current leaves the common node 16. When the ideal gyrator circuit 10 is loaded with a capacitor 18 as illustrated in FIG. 1b, the input impedance looking into port 1 is given by the equation:

$$Z_{in} = z_{11} - \frac{z_{12}z_{21}}{z_{22} + Z_L} = sC/g^2 = sL$$

and the circuit 10 simulates a grounded inductor having a value of $L = C/g^2$. As with the active devices discussed above, however, the use of gyrator circuits in amplifiers in the microwave frequency range has not been successfully accomplished.

Microwave frequency active inductor circuits have been reported which utilize GaAs field effect transistors (FETs), as described in Hara et al., "Broad-Band Monolithic Microwave Active Inductor and Its Application to Miniaturized Wide-Band Amplifiers", *IEEE Transactions on Microwave Theory and Techniques*, MTT-36, No. 12, pp. 1920-24 (Dec. 1988); and Hara et al., "Lossless Broad-Band Monolithic Microwave Active Inductors", *IEEE Transactions on Microwave Theory and Techniques*, MTT-37, No. 12, pp. 1979-84 (Dec. 1989). In the first of these publications, the circuit uses a common source-common gate FET cascode and a feedback resistor to produce inductance in the microwave frequency range. The inductance value is set by the feedback resistor and the series resistance of the realized inductor is approximately equal to $1/g_m$. In the second Hara et al. publication, the circuit employs a FET in a negative resistance configuration as the feedback element. The inductance realized by the second Hara et al. circuit is not as independent of frequency as the previous Hara et al. design, and the possibility of the circuit becoming unstable is significant.

An important aspect of the circuits in both Hara et al. publications is that the two FETs must be matched so that their intrinsic capacitances will cancel each other out. If this were not the case, a flat inductive response in the microwave frequency region would not be possible. Thus, in all cases, for the Hara et al. circuits to be broadband and realize a flat inductive response, the FETs must be identical and under the same bias.

SUMMARY OF THE INVENTION

In view of the foregoing, it is the primary aim of the present invention to provide an active inductor circuit capable of realizing a flat inductive response over a wide range of frequencies in the microwave region.

In accomplishing that aim, it is an object of the present invention to provide a broadband microwave active inductor circuit useful for applications in MMICs.

Another object of the present invention is to reduce the substrate area needed to realize inductance in a MMIC.

In that regard, an additional object of the invention is to provide an active inductor circuit which achieves better performance than that of spiral inductors Still another object of the invention is to provide an active inductor circuit which utilizes transistors, but does not require the transistors to be identical and under the same bias in order to achieve a flat inductive response in the microwave frequency range.

The invention accomplishes these objectives with a broadband microwave active inductor circuit. The active inductor circuit includes a pair of bipolar transistors arranged in a gyrator configuration for producing an active inductance. Because the transistors exhibit intrinsic characteristics which influence the inductive response of the active inductor circuit, a feedback network is connected to the gyrator configuration to compensate for the intrinsic characteristics of the transistors. As a result of the feedback network, the active inductor circuit of the present invention realizes a flat inductive response over a wide range of frequencies including microwave frequencies.

DETAILED DESCRIPTION OF THE PREFERRED EMBODIMENT

While the invention will be described in connection with a preferred embodiment, there is no intent to limit the invention to this embodiment. On the contrary, the intent is to cover all alternatives, modifications and equivalents included within the spirit and scope of the invention as defined by the appended claims.

Figure 1A:
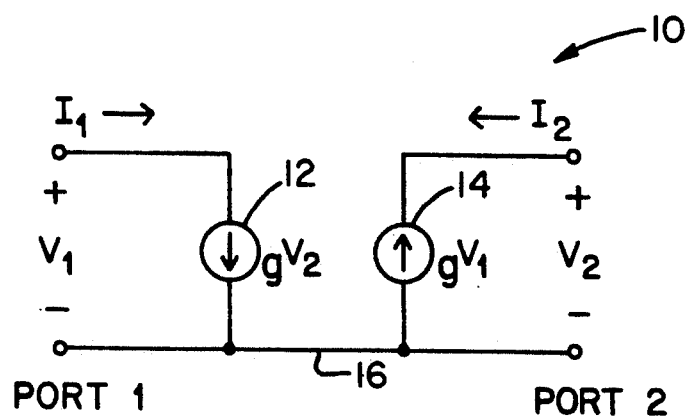
FIG. 1a is a schematic diagram illustrating a circuit model of an ideal gyrator.
Figure 1B:
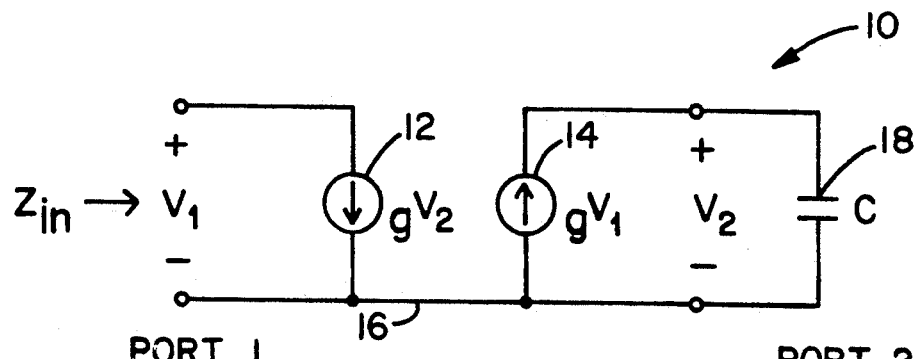
FIG. 1b shows the circuit model of FIG. 1a with a capacitive load connected across the circuit.
Figure 2:
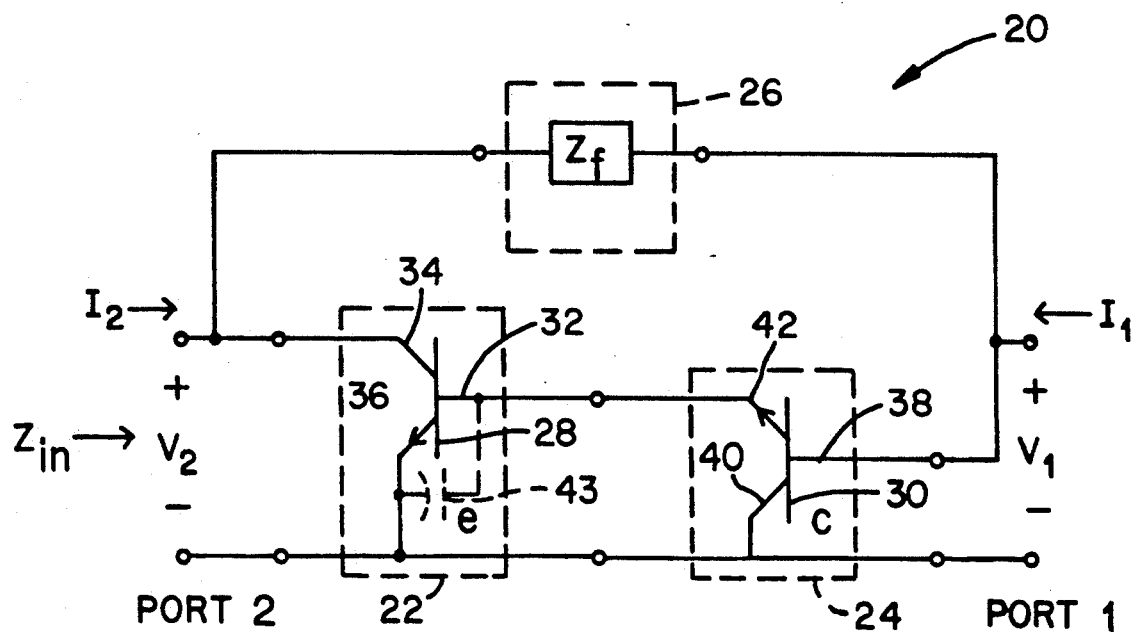
FIG. 2 is a schematic diagram illustrating the active inductor circuit of the present invention.

The broadband microwave active inductor circuit 20 of the present invention is shown in FIG. 2, and includes three two-port networks 22, 24 and 26. As discussed above, an active inductance can be realized with a gyrator configuration when the gyrator is loaded with a capacitor, as depicted in FIG. 1b. As explained in more detail below, in order to approximate gyrator action, the active inductor circuit 20 includes network 22 and network 24 which comprise a pair of bipolar junction transistors (BJTs) 28 and 30 as shown in the preferred embodiment of FIG. 2. Transistor 28 includes a base 32, a collector 34 and an emitter 36. Similarly, transistor 30 includes a base 38, a collector 40, and an emitter 42. Transistors 28 and 30 are connected as a common collector-common emitter (CE-CC) pair, and in order to configure transistors 28 and 30 as a CE-CC pair, emitter 36 of transistor 28 is connected to collector 40 of transistor 30, and emitter 42 of transistor 30 is connected to and drives base 32 of transistor 28.

Figure 3:
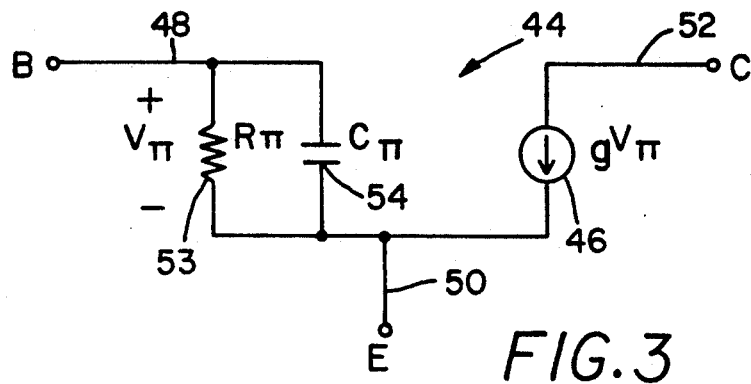
FIG. 3 is schematic diagram illustrating a hybrid-$\pi$ circuit model of a bipolar junction transistor.

In order to simulate gyrator action with transistors, a circuit model which approximates the frequency response of a transistor is employed. As explained above in connection with FIGS. 1a-1b, the gyrator circuit model 10 consists of two voltage controlled current sources 12 and 14, with one current source oriented so that the current leaves the common node 16 and the other oriented so that it enters the common node 16. A convenient circuit model which approximates the frequency response of a BJT is the simplified hybrid-$\pi$ model as illustrated in FIG. 3. The hybrid-$\pi$ model 44 is convenient because it also contains a voltage controlled current source 46 similar to those shown in the gyrator circuit model 10. The hybrid-$\pi$ model 44 of a BJT includes a base 48, an emitter 50, and a collector 52, with a parasitic (i.e., intrinsic) resistance 53 and a parasitic capacitance 54 connected between base 48 and emitter 50.

Referring again to FIG. 2, in order to approximate gyrator action and thereby produce an active inductance, the active inductor circuit 20 utilizes the parasitic capacitance 43 existing between base 32 and emitter 36 of transistor 28 in order to serve as the capacitive load of the gyrator. However, as can be seen in FIG. 3, the hybrid-$\pi$ model 44 of the BJT also includes additional circuit elements, namely the intrinsic resistance 53, such that the load is not purely capacitive. In accordance with the present invention, in order to compensate for this intrinsic resistance, which is exhibited in both transistors 28 and 30, a feedback network 26 is provided as shown in FIG. 2. As explained in greater detail below, feedback network 26 is connected to the CE-CC pair of transistors 28 and 30 to compensate for the intrinsic resistance of the transistors 28 and 30 so that the active inductive circuit 20 provides a flat inductive response over a broad range of frequencies, including microwave frequencies.

Figure 4:
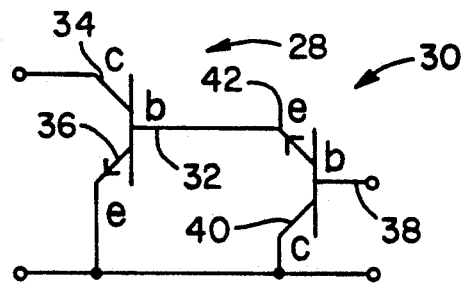
FIG. 4 is a schematic diagram of a BJT common emitter-common collector (CE-CC) pair.
Figure 5:
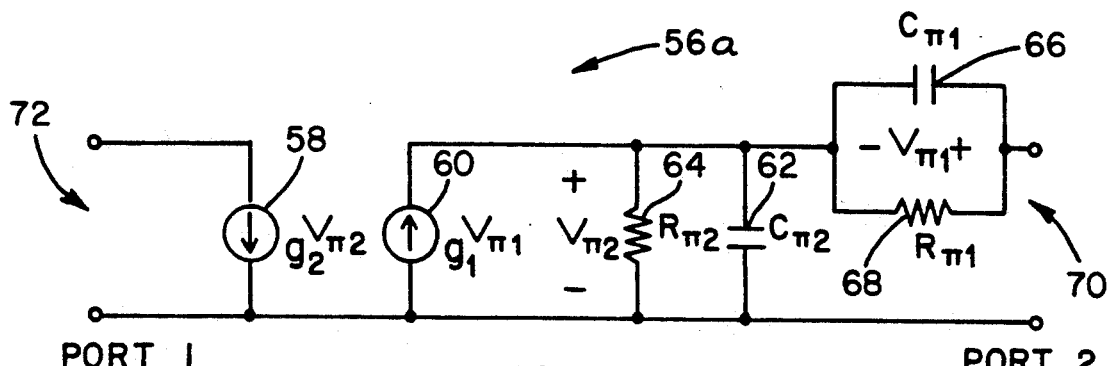
FIG. 5 is the hybrid-$\pi$ circuit model of the CE-CC pair of FIG. 4.

FIGS. 4 and 5 respectively illustrate the circuit connection of the common collector (CC) transistor 30 driving the common emitter (CE) transistor 28, and its equivalent hybrid-$\pi$ circuit model. As depicted in FIG. 5, the equivalent hybrid-$\pi$ model 56a of the CE-CC transistor pair of FIG. 4 includes the desired current source orientation and load capacitor required for inductance simulation. More specifically, model 56a includes a first voltage controlled current source 58 and a second voltage controlled current source 60, with the orientation of the current sources 58 and 60 arranged in a gyrator configuration. Model 56a also includes a parasitic capacitor 62 ($C_{\pi2}$) which corresponds to parasitic capacitor 43 of transistor 28, and serves as the load of the gyrator arrangement so that active inductance can be realized. Accordingly, the CE-CC transistor pair shown in FIG. 4 is capable of approximating gyrator action, since its hybrid-$\pi$ model 56a includes all of the required circuit elements of the gyrator circuit model shown in FIG. 1b.

As is apparent from FIG. 5, model 56a includes additional circuit elements such as a resistor 64 ($R_{\pi2}$) which represents the parasitic resistance exhibited by transistor 28, and a capacitor 66 ($C_{\pi1}$) and a resistor 68 ($R_{\pi1}$) which correspond to the parasitic capacitance and resistance of the common collector transistor 30. At relatively low frequencies, these parasitics have essentially negligible values, and thus do not affect the inductive response of the circuit. However, at higher frequencies in the microwave range, these parasitics become significant and induce roll-off which adversely influences the inductive response of the active inductor circuit 20, and must be compensated for in order to achieve a flat inductive response over a broad range of microwave frequencies. Additionally, as seen in FIG. 5, due to the configuration of the CE-CC transistor pair, the voltage $V_{\pi1}$ which drives the current source 60 is not connected across port 72 (port 1) and is therefore effectively disconnected.

Figure 6:
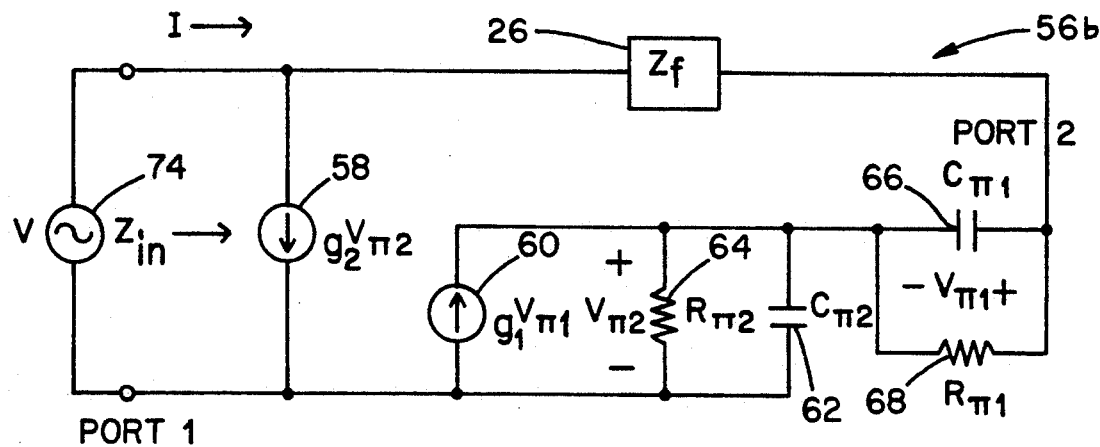
FIG. 6 is the hybrid-$\pi$ circuit model of FIG. 5 with a feedback network connected across the circuit.

In accordance with the present invention, in order to compensate for these additional parasitic characteristics of transistors 28 and 30 so that a flat inductance response over a broad range of microwave frequencies can be achieved, feedback network 26 is connected across the active inductor circuit 20 as shown in FIG. 2 and as also shown in FIG. 6. As explained briefly above, feedback network 26 compensates for the additional parasitic characteristics of the bipolar transistors, and specifically the parasitic resistances of transistors 28 and 30 and the parasitic capacitance of transistor 30 so that the active inductor circuit 20 realizes a flat inductive response. Additionally, feedback network 26 completes the connection between port 1 and common collector transistor 30 so that a gyrator arrangement is fully realized.

In order to achieve a flat inductance versus frequency response for the active inductor circuit 20, it is necessary to determine the impedance of the feedback network ($Z_f$). The input impedance of the hybrid-$\pi$ circuit model 56$b$ shown in FIG. 6 is given by $$Z_{in} = \frac{Z_f + Z_1 + Z_2 + g_1 Z_1 Z_2}{1 + g_2 Z_2(1 + Z_1 g_1)} \tag{1}$$

where $$Z_1 = \frac{R_{\pi 1}}{1 + sC_{\pi 1}R_{\pi 1}} \tag{2a}$$

$$Z_2 = \frac{R_{\pi 2}}{1 + sC_{\pi 2}R_{\pi 2}} \tag{2b}$$

For the ideal active inductor circuit of FIG. 1$b$, all of the current generated by the current sources 12 and 14 flows through the load capacitor 18. In order to achieve a similar result in circuit model 56$b$ of FIG. 6, i.e., to force most of the current I to flow through capacitor 62 ($C_{\pi 2}$) instead of through the feedback network 26 ($Z_f$), the impedance of the feedback network 26 must be large compared to $Z_2$. Furthermore, if the impedance of the feedback network 26 is large, the expression for the input impedance may be simplified under the assumption $$Z_f + g_1 Z_1 Z_2 >> Z_1 + Z_2 \tag{3}$$

To synthesize the feedback network impedance $Z_f$, the expression for the input impedance can be set equal to the physically realizable impedance of an inductor L in series with a resistor R by the equation $$Z_{in} \approx \frac{Z_f + g_1 Z_1 Z_2}{1 + g_2 Z_2(1 + Z_1 g_1)} = R + sL \tag{4}$$

From Eq. 4, the driving point impedance function for the feedback network may be written in the form, $$Z_f = R + \frac{g_2 L}{C_{\pi 2}} + sL + \frac{K(s + \sigma_z)}{(s + 1/R_{\pi 1}C_{\pi 1})(s + 1/R_{\pi 2}C_{\pi 2})} \tag{5}$$

where the coefficients are given by $$K = \frac{g_2}{C_{\pi 1}C_{\pi 2}} \left[ Lg_1 + C_{\pi 1}R - \frac{LC_{\pi 1}}{R_{\pi 2}C_{\pi 2}} \right] \tag{6}$$

$$\sigma_z = \frac{R(g_1 + 1/R_{\pi 1}) - L/R_{\pi 1}R_{\pi 2}C_{\pi 2} - g_1/g_2}{L(g_1 - C_{\pi 1}/R_{\pi 2}C_{\pi 2}) + RC_{\pi 1}} \tag{7}$$

The series resistance and inductance terms in Eq. (5) may be neglected if the third term is made sufficiently large.

Figure 7:
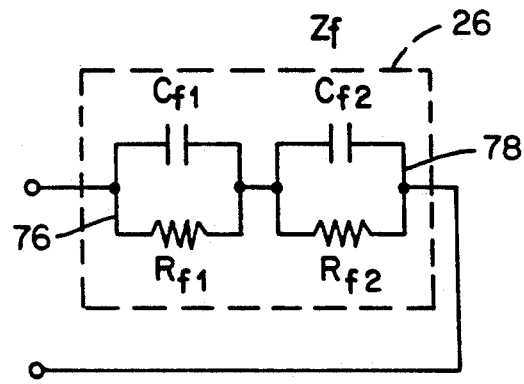
FIG. 7 is a preferred implementation of the feedback network for the active inductor circuit of the present invention.

In keeping with the present invention, the last term of Eq. (5) is physically realizable with two parallel RC networks 76 and 78 connected in series as shown in FIG. 7, but only if the poles and the zeros of the impedance function alternate and the first critical frequency is a pole. The element values for the feedback network 26 are given by the following:

$$R_{f1} = R_{\pi 1}C_{\pi 1}A \tag{8a}$$

$$C_{f1} = 1/A \tag{8b}$$

$$R_{f2} = R_{\pi 2}C_{\pi 2}B \tag{8c}$$

$$C_{f2} = 1/B \tag{8d}$$

where $$A = \frac{K(\sigma_z - 1/R_{\pi 1}C_{\pi 1})}{1/R_{\pi 2}C_{\pi 2} - 1/R_{\pi 1}C_{\pi 1}} \tag{9a}$$

$$B = \frac{K(\sigma_z - 1/R_{\pi 2}C_{\pi 2})}{1/R_{\pi 1}C_{\pi 1} - 1/R_{\pi 2}C_{\pi 2}} \tag{9b}$$

Note that the locations of the poles of the feedback network 26 are the same as the pole locations for the transistor model 56$b$. Accordingly, the feedback network elements can be related to the hybrid-$\pi$ model elements by the following:

$$R_{f1}C_{f1} = R_{\pi 1}C_{\pi 1} \tag{10a}$$

$$R_{f2}C_{f2} = R_{\pi 2}C_{\pi 2} \tag{10b}$$

Eq. (10) represents the conditions for a flat inductance response. If these conditions are satisfied, the low frequency resistance and inductance of the active inductor circuit 20 of the present invention may be approximated by:

$$L \approx \frac{C_{\pi 1}C_{\pi 2}}{g_1 g_2} \left[ \frac{1}{C_{f1}} + \frac{1}{C_{f2}} \right] \tag{11a}$$

$$R \approx \frac{1}{g_1 g_2} \left[ \frac{C_{\pi 1}}{R_{\pi 2}C_{f1}} + \frac{C_{\pi 2}}{R_{\pi 1}C_{f2}} \right] + \frac{1}{g_2} \tag{11b}$$

Figure 8:
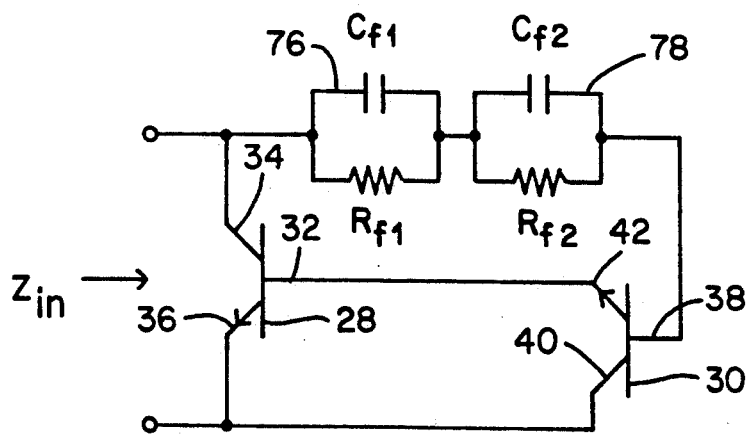
FIG. 8 is a schematic diagram of the active inductor circuit connected to the feedback network shown in FIG. 7.

The complete active inductor circuit design of the present invention is illustrated in FIG. 8. The circuit operation is considerably different from that of the designs of the prior art, such as that shown in the Hara et al. publications discussed above. For example, the active inductor circuit 20 utilizes a common collector-common emitter transistor configuration in the form of a gyrator instead of a cascode arrangement in order to realize a voltage-controlled current source gyrator. Moreover, broadband performance is obtained by compensating for $R_{\pi}C_{\pi}$ via the feedback network 26, whereas the FET active inductor circuit of Hara et al. compensates for $C_{gs}$ by using identical transistors under equal biases. In the present invention, the flatness of the inductive response is not dependent upon the identity of the transistors, but rather is dependent on the product of RC in the individual RC networks 76 and 78 of the feedback network 26 being equal to the product of R and C of the hybrid-$\pi$ models of the transistors.

Common emitter or common collector scattering parameters (S-parameters) are often available for microwave transistors, and it is therefore convenient to analyze the active inductor circuit in terms of S-parameters. For a given quiescent point (q-point) and drive level, the S-parameters of a transistor completely describe the frequency response of the device. Therefore, the S-parameter matrix of the device at a specific q-point and drive level is a very accurate model for use in circuit analysis. Impedance calculations for the active inductor circuit 20 made with transistor S-parameters that have been measured with rf probes directly off the wafer should represent the performance limit of the circuit when realized as a MMIC.

Referring again to FIG. 2, active inductor circuit 20 is separated into three two port networks as shown. The unknown parameter is the impedance $Z_{in}$ looking into port 2 with port 1 open circuited which is by definition $z_{22}$ of the z-parameter matrix for the network;

$$Z_{in} = z_{22} = \frac{D + Y_f B}{C + Y_f(BC - AD + A + D - 1)} \quad (12)$$

where $Y_f$ is the admittance of the feedback network 26. Assuming that the common emitter S-parameters are known for the transistors, the ABCD matrix of the cascade is given by the following:

$$\begin{bmatrix} A & B \\ C & D \end{bmatrix} = \begin{bmatrix} A_c & B_c \\ C_c & D_c \end{bmatrix} \begin{bmatrix} A_e & B_e \\ C_e & D_e \end{bmatrix} \quad (13)$$

where $$A_c = [(1-S_{12})(1-S_{21}) - S_{11}S_{22}]/(\Delta_c/2) \quad (14a)$$

$$B_c = [(1+S_{11})(1+S_{22}) - S_{12}S_{21}]/(\Delta_c/Y_o) \quad (14b)$$

$$C_c = [(1-S_{11})(1-S_{22}) - S_{12}S_{21}]/(\Delta_c/Z_o) \quad (14c)$$

$$D_c = [(1-S_{11})(1+S_{22}) + S_{12}S_{21}]/\Delta_c \quad (14d)$$

$$\Delta_c = (1-S_{11})(1+S_{22}) + S_{12}S_{21} - 2S_{21} \quad (14e)$$

$$A_e = [(1+S_{11})(1-S_{22}) + S_{12}S_{21}]/(2S_{21}) \quad (15a)$$

$$B_e = [(1+S_{11})(1+S_{22}) - S_{12}S_{21}]/(2Y_o S_{21}) \quad (15b)$$

$$C_e = [(1-S_{11})(1-S_{22}) - S_{12}S_{21}]/(2Z_o S_{21}) \quad (15c)$$

$$D_e = [(1-S_{11})(1+S_{22}) + S_{12}S_{21}]/(2S_{21}) \quad (15d)$$

For the results given by Eq. (14) to be valid, the parasitics from the emitter to ground in the common emitter S-parameters are assumed to be negligible. If common collector S-parameters are known instead of common emitter, then the subscript "e" and "c" on [ABCD] for Eq. (14) and Eq. (15) should be reversed.

Figure 9:
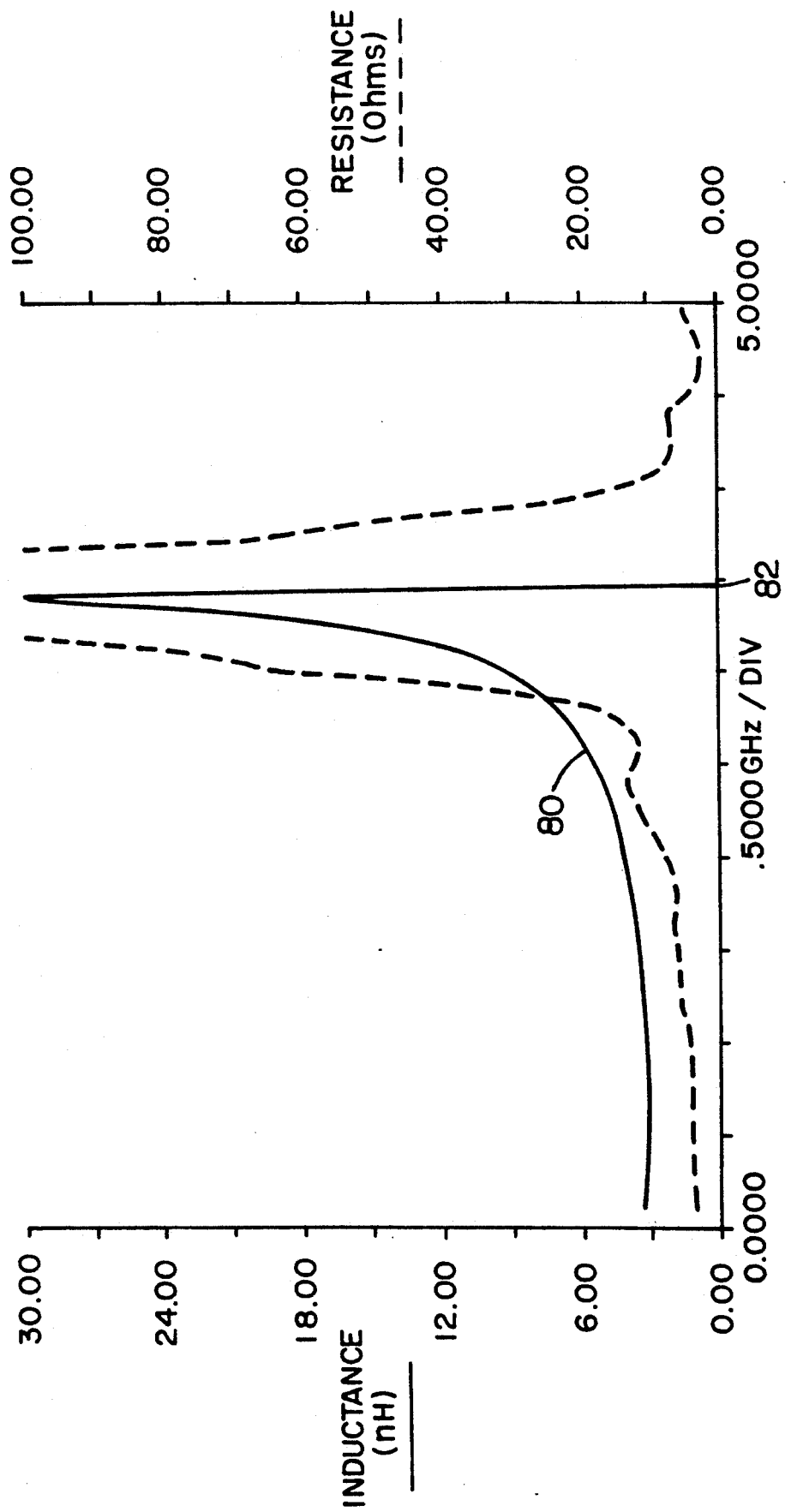
FIG. 9 is a graph illustrating the inductance and resistance versus frequency of the active inductor circuit using S-parameter analysis.

The impedance of the active inductor circuit 20 can be calculated with Eq. (12) given the impedance of the feedback network 26 and a set of common emitter or common collector S-parameters for the transistors. In a practical implementation of the present invention, common emitter S-parameters for the NEC NE57800 microwave BJT as provided by the manufacturer at a variety of q-points are utilized. Using NE57800 S-parameters, the results of a simulation of the active inductor circuit 20 under the following conditions are shown in FIG. 9.

CE S-parameters: $i_c = 10$ mA $V_{ce} = 8$ V
CC S-parameters: $i_c = 3$ mA $V_{ce} = 8$ V
Feedback elements:
   $R_{f1} = 1.2$ k$\Omega$
   $C_{f1} = 0.9$ pF
   $R_{f2} = 700$ $\Omega$
   $C_{f2} = 1$ pF Examining the results shown in FIG. 9, it can be seen that the active inductor circuit 20 of the present invention does indeed realize inductance at microwave frequencies. As indicated by reference numeral 80, up to 2.5 GHz the inductance is equal to about $4 \pm 1$ nH, and the resistance is less than 15 $\Omega$, which demonstrates that the synthesis technique of the present invention achieves a constant inductance and resistance over a limited, yet wide frequency range. Thus, the active inductor circuit 20 indeed achieves a flat inductive response over a broad range of microwave frequencies. Above 2.5 GHz, the inductance rises rapidly to 31 nH at 3.4 GHz and then falls off at the resonant frequency of 3.45 GHz, denoted as reference numeral 82. Near resonance, the resistance of the active inductor circuit 20 increases rapidly to a maximum value of about 2.3 k$\Omega$ and then decreases to a few ohms. It should be noted that if the impedance of the feedback network 26 is made too small the resistance will become negative near resonance, which causes the circuit to become potentially unstable.

As stated previously, the motivation for investigating microwave frequency active inductor circuits is to replace grounded spiral inductors in MMIC designs. To be useful for this application, the performance of the active inductor circuit 20 of the present invention must compare favorably with that of spiral inductors. Such comparisons can be made by investigating the relative bandwidth, quality factor (Q), and size between spiral inductors and active inductor circuits.

In the active inductor circuit 20 of the present invention, the upper limit of the bandwidth has been calculated using the S-parameters for silicon bipolar junction transistors that have maximum unity gain frequencies ($f_T$) of 4.5 GHz and 6.0 GHz. For the S-parameter simulations of the active inductor circuit 20, the resonant frequency increases as the inductance decreases until about $f_T/2$ and then flattens out. Thus, the approximate upper limit of the bandwidth for the active inductor circuit 20 is given by $$f_{max} \approx f_T/2$$

For the devices considered, the spiral inductor has a broader bandwidth than the active inductor circuit 20. However, the resonant frequency of the active inductor circuit 20 increases as higher $f_T$ devices are used to realize the circuit. For example, if heterojunction bipolar transistors (HBTs) which have extrapolated unity gain frequencies greater than 60 GHz are utilized to realize the active inductor circuit, a broader bandwidth than spiral inductors can be achieved. In that regard, it should be understood that the design of the active inductor circuit of the present invention is not limited to the use of only bipolar junction transistors, but can utilize HBTs as well.

In addition to the foregoing, the inductance response of the active inductor circuit 20 is tunable. For example, a change in the collector current of the common collector transistor 30 can result in an inductance response that either increases or decreases with increasing frequency depending on the direction of the current change. The active inductor circuit 20 also experiences better performance over its operating frequency than spiral inductors. For example, using the S-parameter analysis above, the active inductor circuit 20 realizes the same inductance, within 1 nH, as the spiral inductor up to a frequency of 2.1 GHz. Within this frequency range, the maximum resistance of the active inductor circuit 20 is 9 Ω and the maximum quality factor (Q) is 8.5 compared to a maximum resistance and Q of 12.6 Ω and 3.5 respectively for a spiral inductor.

As stated previously, a significant advantage of using an active inductor circuit in a MMIC is the reduction of the substrate area. In order to change the inductance of the active inductor circuit 20, it is only necessary to vary the value of the feedback elements in the feedback network 26. Because the substrate area occupied by the feedback network 26 is small compared to that of the dc blocking capacitors in a MMIC, the area of the active inductor circuit 20 is essentially independent of the realized inductance. As an example, an integrated version of a fabricated active inductor circuit 20 requires a substrate area of only about 0.25 mm². Higher frequency designs would require even less substrate area since smaller blocking capacitors and transistors could be used. In contrast, for spiral inductors, the required substrate area increases with inductance. Thus, for large inductances, the active indicator circuit 20 requires less substrate area than spiral inductors.

As is evident from the foregoing description the active inductor circuit of the present invention achieves a flat inductance response over a broad range of frequencies within the microwave frequency range. The active inductor circuit provides significant advantages over spiral inductors, including better operating performance and reduced substrate area for large inductance. Additionally, unlike previous active inductor circuits, the circuit design of the present invention does not require that identical transistors be employed under the same bias in order to achieve a flat broadband inductive response.

We claim:

1. A broadband microwave active inductor circuit for producing a flat inductive response versus frequency comprising:
    a pair of bipolar transistors connected in a gyrator configuration for producing an active inductance, the transistors exhibiting intrinsic characteristics which influence the inductive response of the active inductor circuit, with one of the transistors including a parasitic capacitance serving as a load for the gyrator configuration to produce the active inductance; and
    a feedback network connected to the gyrator configuration to compensate for the intrinsic characteristics of the transistors so that the active inductor circuit realizes a flat inductive response over a wide range of frequencies including microwave frequencies.

2. The circuit as set forth in claim 1 wherein the pair of bipolar transistors comprise first and second bipolar junction transistors (BJTs) each having a base, a collector, and an emitter, and wherein the first and second transistors are connected as a common emitter--common collector (CE-CC) pair.

3. The circuit as set forth in claim 2 wherein the parasitic capacitance is between the base and emitter of the first common emitter transistor and serves as the load for the gyrator configuration in order to produce the active inductance.

4. The circuit as set forth in claim 3 wherein the intrinsic characteristics of the transistors include a parasitic resistance of the first and second BJTs and a parasitic capacitance of the second common collector BJT.

5. The circuit as set forth in claim 1 wherein the feedback network comprises a first parallel resistor-capacitor network connected in series with a second parallel resistor-capacitor network.

6. The circuit as set forth in claim 1 wherein the transistors comprise a pair of heterojunction bipolar transistors.

7. A broadband microwave active inductor circuit comprising:
    a pair of bipolar transistors connected in a gyrator configuration for producing an active inductance including
    a first bipolar transistor having a base, an emitter, and a collector, and
    a second bipolar transistor having a base, an emitter, and a collector, the emitter of the first transistor connected to the collector of the second transistor and the base of the first transistor connected to the emitter of the second transistor so that the first and second transistors are configured as a common emitter--common collector pair, and wherein the first and second transistors exhibit intrinsic characteristics which influence the inductive response of the active inductor circuit; and
    a feedback network connected to the gyrator configuration to compensate for the intrinsic characteristics of the first and second transistors so that the active inductor circuit provides a flat inductive response for a broad range of frequencies including microwave frequencies, the feedback network comprising a first parallel resistor-capacitor network connected in series with a second parallel resistor-capacitor network.

8. The circuit as set forth in claim 7 wherein a parasitic capacitance between the base and the emitter of the first bipolar transistor serves as a load for the gyrator for producing the active inductance.

9. The circuit as set forth in claim 8 wherein the pair of bipolar transistors comprise bipolar junction transistors.

10. The circuit as set forth in claim 9 wherein the intrinsic characteristics of the transistors include a parasitic resistance of the first and second BJTs and a parasitic capacitance of the second common collector BJT.

11. The circuit as set forth in claim 7 wherein the pair of bipolar transistors comprise heterojunction bipolar transistors.

12. A method of simulating an inductor having a flat inductive response at microwave frequencies comprising:
    connecting a pair of bipolar transistors in a gyrator configuration to produce an active inductance, the transistors exhibiting parasitic characteristics which influence the inductive response of the gyrator configuration at microwave frequencies, with one of the transistors including a parasitic capacitance serving as a load for the gyrator configuration to produce the active inductance; and
    inserting a feedback network across the gyrator configuration to compensate for the parasitic characteristics of the transistors in order to realize a flat inductive response over a broad range of microwave frequencies.

13. The method as set forth in claim 12 wherein the pair of bipolar transistors comprise first and second bipolar junction transistors (BJTs) each having a base, a collector, and an emitter, and wherein the first and second transistors are connected as a common emitter--common collector (CE-CC) pair.

14. The method as set forth in claim 13 wherein the parasitic capacitance is between the base and emitter of the first common emitter transistor and serves as the load for the gyrator configuration in order to produce the active inductance.

15. The method as set forth in claim 14 wherein the parasitic characteristics of the transistors include a parasitic resistance of the first and second BJTs and a parasitic capacitance of the second common collector BJT.

16. The method as set forth in claim 12 wherein the feedback network comprises a first parallel resistor-capacitor network connected in series with a second parallel resistor-capacitor network.

17. The method as set forth in claim 12 wherein the transistors comprise a pair of heterojunction bipolar transistors.

* * * * *